United States Patent
Bhatia et al.

(10) Patent No.: US 7,704,802 B2
(45) Date of Patent: Apr. 27, 2010

(54) PROGRAMMABLE RANDOM LOGIC ARRAYS USING PN ISOLATION

(75) Inventors: Harsaran S. Bhatia, Hopewell Junction, NY (US); Eric Kline, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 182 days.

(21) Appl. No.: 11/871,484

(22) Filed: Oct. 12, 2007

(65) Prior Publication Data

US 2008/0032460 A1 Feb. 7, 2008

Related U.S. Application Data

(62) Division of application No. 11/211,813, filed on Aug. 25, 2005, now Pat. No. 7,420,248.

(51) Int. Cl.
*H01L 21/84* (2006.01)
(52) U.S. Cl. .................................. 438/128; 257/E27.07
(58) Field of Classification Search ................. 438/128, 438/479; 257/E27.112, E21.703, 347, E27.07, 257/E27.105
See application file for complete search history.

(56) References Cited

U.S. PATENT DOCUMENTS 4,026,736 A   5/1977   Lesk
4,794,442 A  12/1988   Warner, Jr. et al.
4,933,736 A *  6/1990   Conner et al. ............... 257/390
5,629,537 A   5/1997   Nagamatsu et al.
6,314,540 B1 11/2001   Huott et al.
6,326,221 B1 12/2001   Lee et al.
6,541,804 B2  4/2003   Tihanyi
6,812,516 B2 11/2004   Noble et al.
6,856,542 B2  2/2005   Rey et al.

\* cited by examiner

*Primary Examiner*—Thomas L Dickey
*Assistant Examiner*—Fazli Erdem
(74) *Attorney, Agent, or Firm*—Scully, Scott, Murphy & Presser, P.C.; Joseph P. Abate, Esq.

(57) ABSTRACT

Disclosed are a programmable, random logic device array, and a method of forming such a device. The device comprises a substrate, and a semiconductor layer above the substrate. That semiconductor layer, in turn, includes a first region of a first semiconductor type, an array of spaced apart second regions of a second semiconductor type, and a plurality of space-charge regions. Each of the space charge regions extends around a respective one of the second regions and separates that one of the second regions from the first region of the semiconductor layer. The programmable, random, logic device array further comprises first and second sets of contacts. The first set of contacts are in electrical contact with areas of said first region of the semiconductor layer, and the second set of contacts are in electrical contact with the second regions.

6 Claims, 4 Drawing Sheets

PROGRAMMABLE RANDOM LOGIC ARRAYS USING PN ISOLATION

CROSS REFERENCE TO RELATED APPLICATION

This application is a divisional application of copending application Ser. No. 11/211,813, filed on Aug. 25, 2005.

BACKGROUND OF THE INVENTION

1. Field of the Invention

This invention generally relates to integrated circuits. More specifically, the invention relates to random logic integrated circuit devices, and to methods for making such circuits.

2. Background Art

Integrated circuits are an essential part of digital systems, such as computers. One challenge to the manufacturers of such circuits is to provide each customer with a circuit that is or can be tailored to the specific needs of that customer.

There are several ways to address this challenge. One way is to provide circuits that are programmable or have random logic. Logic can be designed and fixed, as in a gate array (GA) device, so that earlier, or "front end" (FE), process steps used in the manufacture of the circuits are quite generic, in particular, with respect to implantation and contact. Personalization of the devices can be entirely or substantially accomplished in the later, or "back end" (BE), metalization steps used in the manufacture of the circuit.

Further, logic can be re-programmed, as in field programmable gate arrays (FPGAs). Alternatively, the logic can be defined real-time, yielding a dynamically reconfigurable/random logic device.

While various ways are known to provide random logic, they tend to require relatively complex designs and manufacturing processes.

SUMMARY OF THE INVENTION

An object of this invention is to improve programmable random logic array devices and methods for making such devices.

Another object of the present invention is to use PN isolation in a programmable random logic array.

A further object of the invention is to provide an ordered array of spaced apart PN junctions to form a programmable device array.

These and other objectives are attained with a programmable, random logic device array, and a method of forming such a device. The device comprises a substrate, and a semiconductor layer above the substrate. That semiconductor layer, in turn, includes a first region of a first semiconductor type, an array of spaced apart second regions of a second semiconductor type, and a plurality of space-charge regions. Each of the space charge regions extends around a respective one of the second regions and separates that one of the second regions from the first region of the semiconductor layer.

The programmable, random, logic device array further comprises first and second sets of contacts. Each of the first set of contacts is above and in electrical contact with a respective one area of said first region of the semiconductor layer, and each of the second set of contacts is above and in electrical contact with a respective one of the second regions. In this way, the electrical contacts facilitate connecting together said areas of the first region and the second regions in various, programmable ways.

The preferred embodiment of the invention has a number of important advantages, and can be provided with a number of additional features. For example, in one method for making the logic array, front-end processes (e.g., implantation, active devices) are generic or substantially generic, some are common between multiple devices, and devices can be defined into specific types by hard-wire (netlist). Also, the active devices of the logic array may be PN junctions formed adjacent to one another so that their overlap regions form a space-charge region, thus isolating one device from another (in two or three dimensions).

In addition, in the preferred procedure for making the logic array, the front-end devices can be formed over an entire wafer or regions of fixed or arbitrary geometry. Personalization may be accomplished or substantially accomplished via metal patterning in the back end processes. Further, preferably the invention is practiced on silicon on oxide (SOI) to reduce or minimize formation of parasitic transistor/path during circuit operation.

In an alternative embodiment of the invention, alternating P and N regions can be utilized as isolation regions rather than directly as active devices. In this case, leakage from circuit blocks of dissimilar conductivity type does not affect circuits in neighboring regions.

It may be noted that the present invention may be very useful as voltage thresholds (Vt's) are decreasing and critical geometries are decreasing, and, for these reasons, a simpler fabrication may be desirable as processing drives below ninety nanometers. Also, as channel thicknesses decrease, leakage may be mitigated to a point where the present invention is particularly valuable. The present invention may also reduce fabrication costs, since the fabrication process is simpler and supports generic (FE) precursors.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

The invention will now be described by reference to the accompanying figures. In these figures, various aspects of the structures have been shown and schematically represented in a simplified manner to more clearly describe and illustrate the invention. For example, the figures are not intended to be to scale. In addition, various aspects of the structures are illustrated as having particular shapes; however, as those skilled in the art will appreciate, the invention is not limited to constructions of any particular shape.

Figure 1:
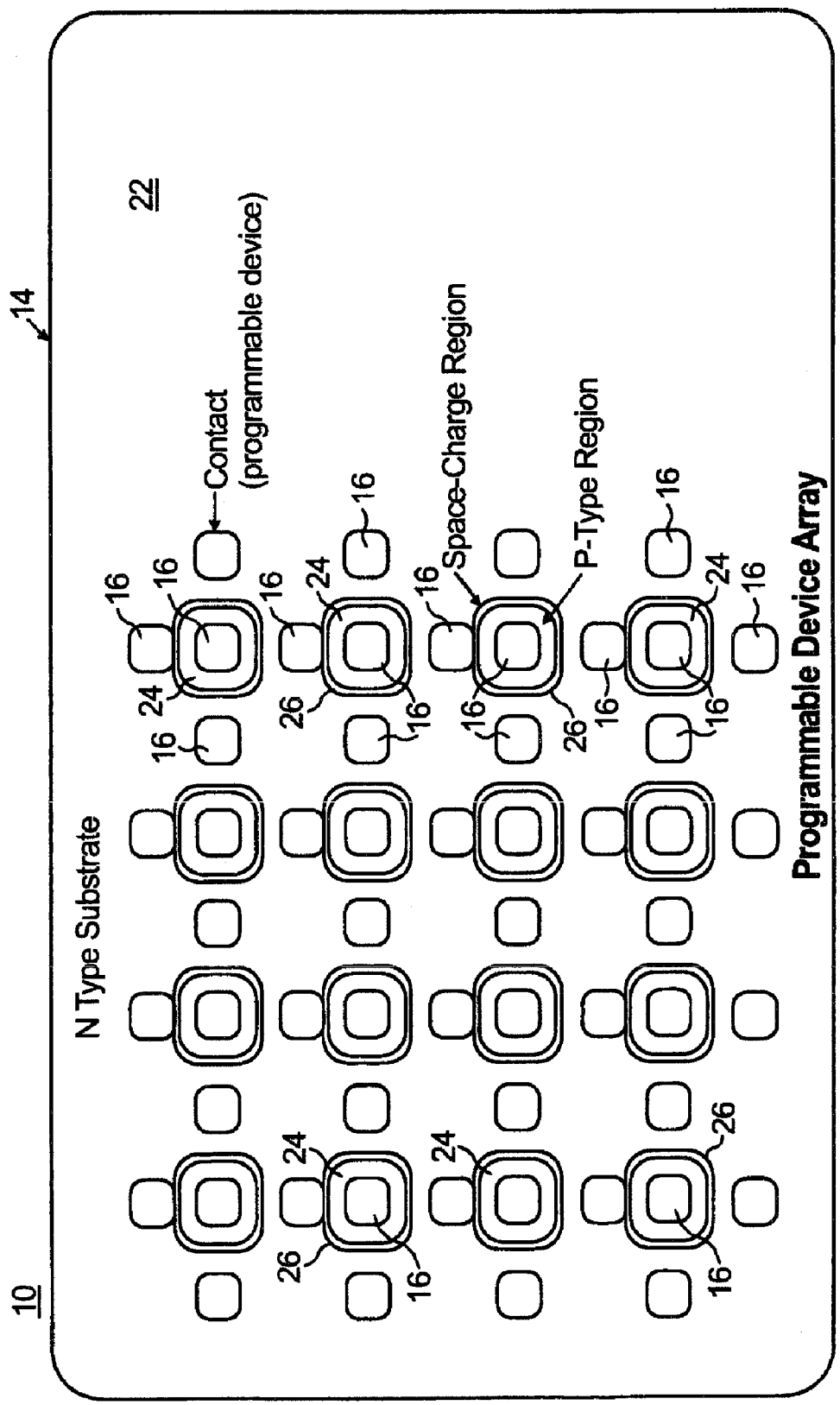
FIG. 1 is a top plane view illustrating a first embodiment of the invention.
Figure 2:
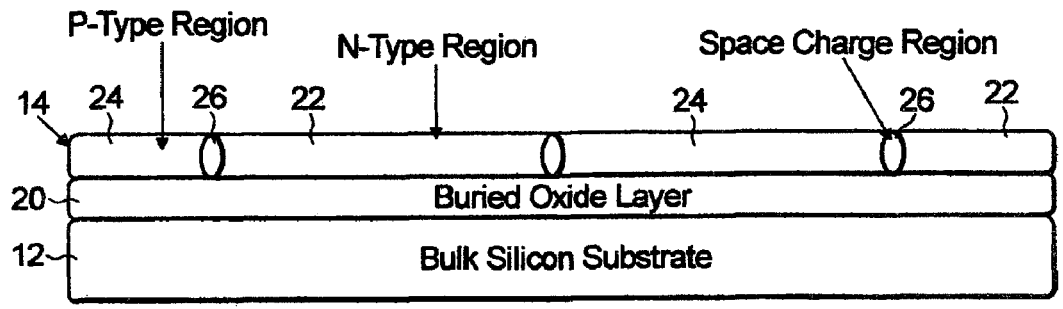
FIG. 2 is a vertical cross-sectional view of the semiconductor structure of FIG. 1.

As mentioned above, this invention generally relates to integrated circuits or semiconductor structures or wafers. FIGS. 1 and 2 show a semiconductor structure or wafer 10 comprising lower substrate 12, upper semiconductor layer 14, and a series of contacts, generally referenced at 16; and preferably, structure 10 further comprises oxide layer 20 between substrate 12 and layer 14.

Upper layer 14, in turn, includes N-type region 22, an array of P-type regions 24, and a multitude of space-charge regions 26. With the embodiment of structure 10 shown in FIGS. 1 and 2, upper layer 14 is comprised primarily of the N-type region 22, the P-type regions 24 are spaced apart in layer 14, and each of those P-type regions is surrounded by a respective one of the space-charge regions. 26. More specifically, with this embodiment, P-type regions 24 are uniformly spaced apart in an orthogonal grid pattern, including parallel rows and parallel columns, with the rows perpendicular to the columns.

Contacts 16 are provided to help connect together various areas of the N-region and various P-regions of layer 14. More particularly, a first set of the contacts are above and in electrical contact with specific areas of N-region 22, and a second set of the contacts are above and in electrical contact with P regions 24. With the arrangement shown in FIG. 1, the first set of contacts are located on the rows and columns of the grid formed by the P-regions 24. Further, four of these first set of contacts are uniformly spaced around each P-region—above, below, to the left, and to the right of that P-region.

Figure 4:
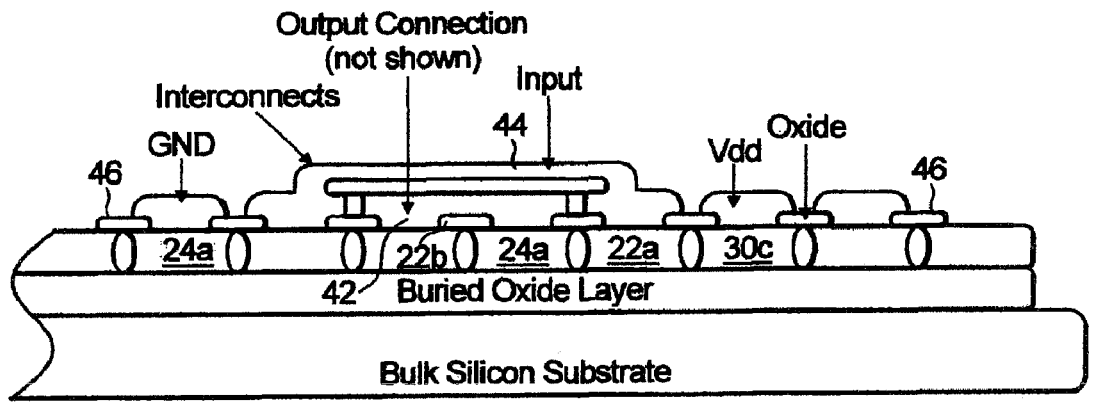
FIGS. 3 and 4 show how elements of the array of FIG. 1 may be connected together to form a CMOS inverter.
Figure 3:
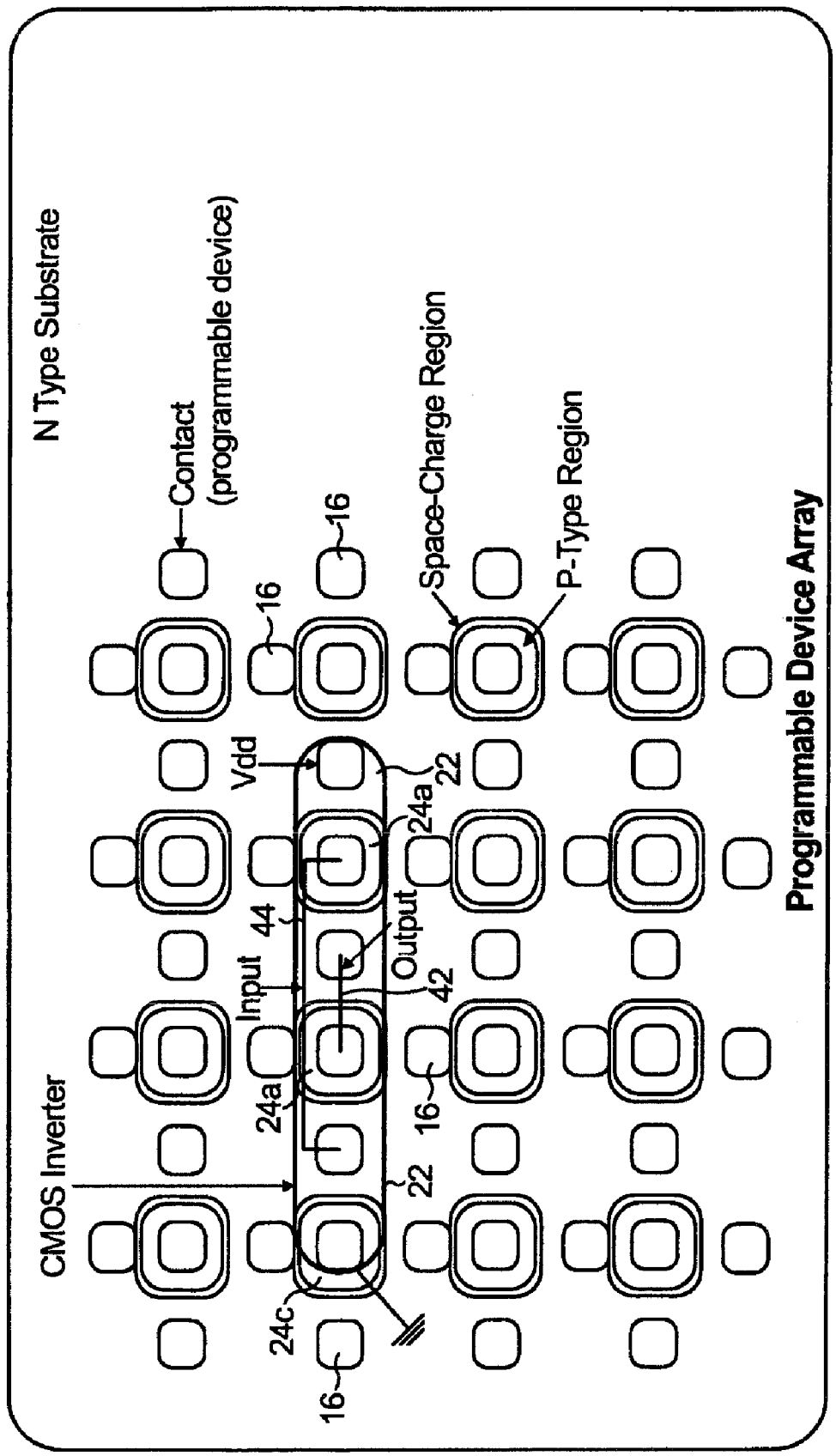

The P- and N-regions of layer 14 may be connected together in a large number of ways to form many specific devices. For instance, FIGS. 3 and 4 show one way of connecting the P- and N-regions together to form an inverter. Specifically, to form this inverter, which is schematically represented at 40 in FIG. 5, a P-region 24a and an adjacent area 22a of the N-region are connected via an output connection 42. Also, the N-type area 22b immediately to the left of P-region 24a, and the P-region 24b immediately to the right of N-type area 22a are connected via an input connection 44. P region 24c to the left of N area 22b is connected to ground, and the N area 22c to the right of P-region 24b is connected to a source voltage Vdd. Preferably, it may be noted, and as shown in FIG. 4, oxide caps 46 are deposited above the space charge regions 26 surrounding the P-regions in order to insulate those space charge regions from the connectors 42 and 44.

With reference again to FIGS. 1 and 2, structure 10 may be made in any suitable way. Lower substrate 12 may be made of any suitable material, and for example, this substrate may be a bulk silicon substrate. Layer 20, as mentioned above, is preferably comprised of an oxide material, and is deposited on substrate 12 in any suitable way.

Semiconductor layer 14 may be formed by providing a suitable substrate, and then implanting N-type dopants to form N-region 22, and implanting P-type dopants to form P-regions 24. Contacts 16 may be affixed in place on top of the N-region and P-regions.

It may be noted that space-charge regions 26 are preferably formed naturally as the result of implanting the P-type dopants in regions 24. In particular, in this implantation process, the P-type dopants migrate into N-region 22 and form an isolation interface between a P-region and the surrounding N-region.

Any suitable dopants may be used to form the N- and P-regions; and for example, the N-type dopants may be phosphorous or arsenic ions, and the P-type dopants may be boron ions. Also, any suitable masking technique or other suitable targeted ion implantation process may be used to implant the N and P type dopants in the desired areas of layer 14.

Figure 6:
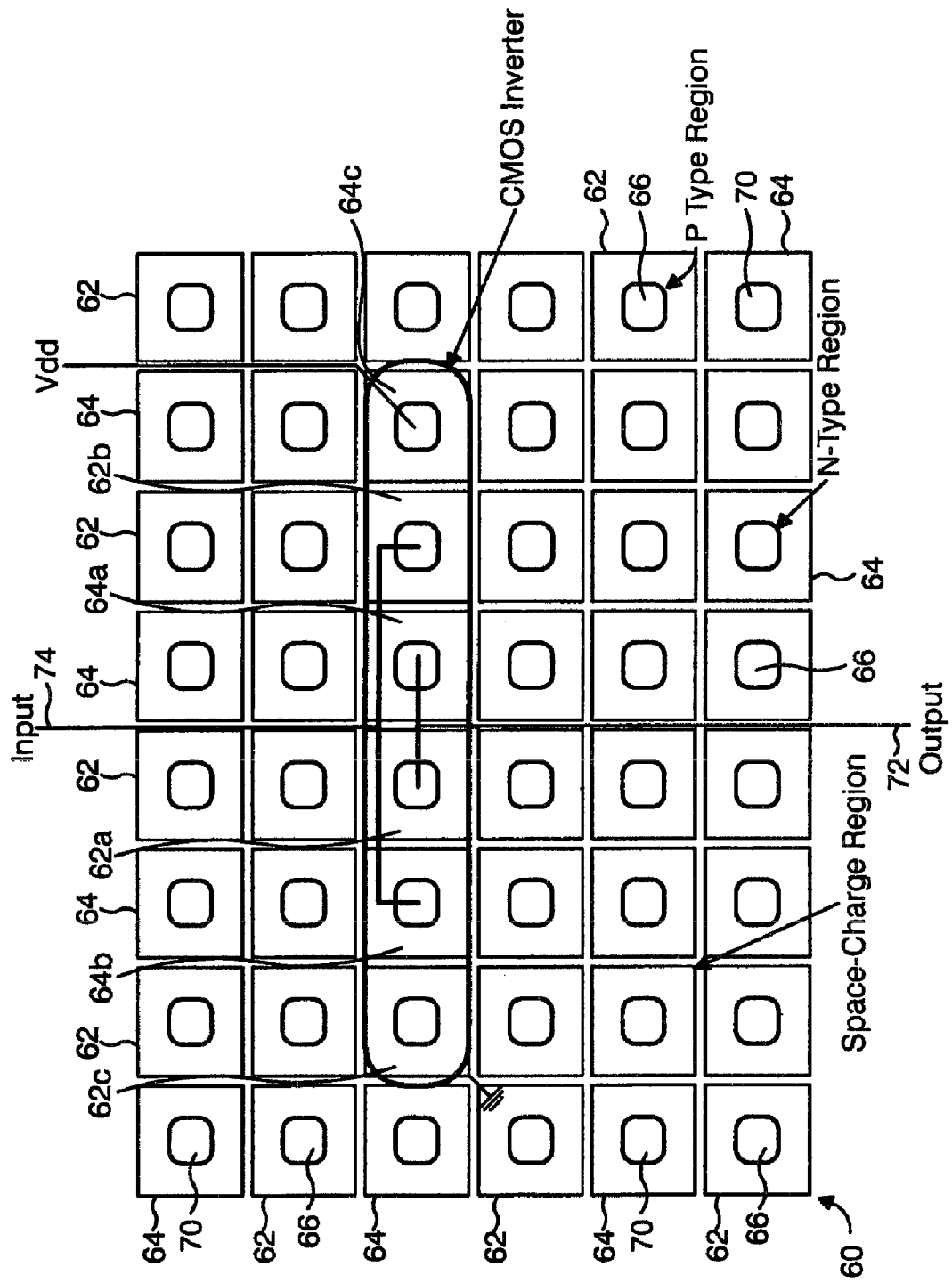
FIG. 6 illustrates a second embodiment of the invention.

FIG. 6 shows an alternate semiconductor layer 60 that can also be used in the practice of this invention. In layer 60, the P-regions 62 separate the N-type material into a multitude of separate N-regions 64. Semiconductor layer 60 of FIG. 6 thus has alternating P and N regions, both in the horizontal direction and in the vertical direction, forming a checkerboard pattern. A first set of contacts, generally referenced at 66, are affixed on the P-regions 62, and a second set of contacts, generally referenced at 70, are affixed on the N-regions 64.

Figure 5:
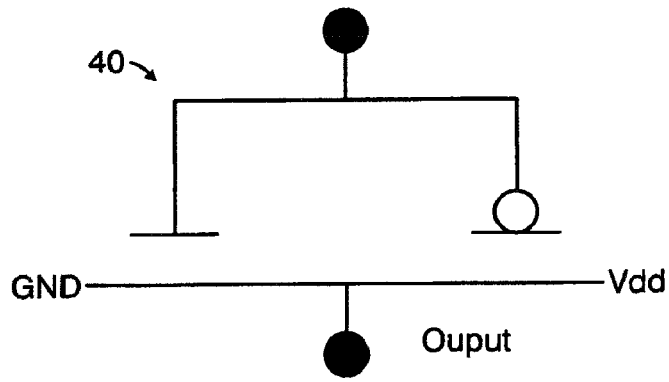
FIG. 5 schematically illustrates the CMOS inverter formed by the array of FIG. 3.

FIG. 6 also illustrates how the P and N regions of semiconductor layer 60 can be connected together to form an inverter, which is also represented by the schematic in FIG. 5. Specifically, a pair of adjacent P and N regions are connected together via output connector 72, and the N region 64b to the left of P region 62a is connected to the P region 62b to the right of N region 64a via input connector 74. P region 62c, which is to the left of N region 64b, is connected to ground, and N region 64c, which is to the right of P region 62b, is connected to Vdd.

The preferred embodiment of the invention has a number of important advantages, and can be provided with a number of additional features. For example, when making the logic array, front-end processes (e.g., implantation, active devices) are generic or substantially generic, some are common between multiple devices, and devices can be defined into specific types by hard-wire (netlist). Also, the active devices of the logic array may be PN junctions formed adjacent to one another so that their overlap regions form a space-charge region, thus isolating one device from another (in two or three dimensions).

In addition, in the preferred procedure for making the logic array, the front end devices can be formed over an entire wafer or regions of fixed or arbitrary geometry. Personalization may be accomplished or substantially accomplished via metal patterning in the back end processes. Further, preferably the invention is practiced on silicon on oxide (SOI) to reduce or minimize formation of parasitic transistor/path during circuit operation.

Moreover, the present invention may be very useful as voltage thresholds (Vt's) are decreasing and critical geometries are decreasing, and, for these reasons, a simpler fabrication may be desirable as processing drives below ninety nanometers. Also, as channel thicknesses decrease, leakage may be mitigated to a point where the present invention is particularly valuable. The present invention may also reduce fabrication costs, since the fabrication process is simpler and supports generic (FE) precursors.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

What is claimed is:

1. A method of forming an integrated circuit wafer structure having a programmable, random logic array, comprising the steps:

providing a substrate;
   forming a semiconductor layer above the substrate, including the steps of
   i) forming a first region of a first semiconductor type,
   ii) forming an array of spaced apart second regions of a second semiconductor type, and
   iii) forming a plurality of space-charge regions, wherein each of the space charge regions extends around a respective one of said second regions and separates said one of the second regions from the first region of the semiconductor layer, and wherein the step of forming an array of spaced apart second regions includes the step of forming each of the second regions contiguous with and surrounded by a respective one of the space-charge regions; and positioning a first set of contacts above and in physical and electrical contact with a respective one area of said first region of the semiconductor layer; and positioning a second set of contacts above and in physical and electrical contact with a respective one of said second regions;

wherein said first and second sets of contacts facilitate connecting together the said areas of the first region and said second regions of the semiconductor layer in various, programmable ways.

2. A method according to claim 1, wherein:

the step of forming the first region includes the steps of providing a semiconductor material, and implanting ions of the first semiconductor type into said material to form said first region;

the step of forming the array of second regions includes the step of implanting ions of the second semiconductor type into said semiconductor material to form said second regions; and ions of said second type migrate from said second regions into said first regions and ions of the first type migrate from the first region into said second region to cause intermingling of ions of both the first and second types in the first and second regions to form said space-charge regions.

3. A method according to claim 2, wherein the step of forming the array of second regions includes the further step of forming said second regions uniformly spaced apart in an orthogonal grid pattern.

4. A method according to claim 3, wherein the step of positioning the first set of contacts includes the step of locating a group of said first set of contacts uniformly spaced around each of said second regions.

5. A method according to claim 1, comprising the further step of personalizing said integrated circuit wafer structure via back-end metalization.

6. The method according to claim 1, wherein the step of forming the plurality of space-charge regions includes the step of implanting both N type ions and P type ions into each of the space-charge regions.

\* \* \* \* \*